United States Patent
Bassett et al.

(10) Patent No.: US 10,886,290 B2
(45) Date of Patent: Jan. 5, 2021

(54) ETCHING OF SILICON NITRIDE AND SILICA DEPOSITION CONTROL IN 3D NAND STRUCTURES

(71) Applicant: Tokyo Electron Limited, Tokyo (JP)

(72) Inventors: Derek Bassett, Austin, TX (US); Antonio Rotondaro, Austin, TX (US); Ihsan Simms, Austin, TX (US); Trace Hurd, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/517,097

(22) Filed: Jul. 19, 2019

(65) Prior Publication Data

US 2020/0027891 A1   Jan. 23, 2020

Related U.S. Application Data

(60) Provisional application No. 62/701,398, filed on Jul. 20, 2018.

(51) Int. Cl.
*H01L 27/11556* (2017.01)
*H01L 27/11582* (2017.01)
*H01L 27/1157* (2017.01)
*H01L 27/11524* (2017.01)

(52) U.S. Cl.
CPC .... *H01L 27/11556* (2013.01); *H01L 27/1157* (2013.01); *H01L 27/11524* (2013.01); *H01L 27/11582* (2013.01)

(58) Field of Classification Search
CPC ......... H01L 27/11556; H01L 27/11582; H01L 27/1157; H01L 27/11524; H01L 21/31111
See application file for complete search history.

(56) References Cited

U.S. PATENT DOCUMENTS

| 10,325,779 B2 | 6/2019 | Rotondaro et al. |
| 10,515,820 B2 | 12/2019 | Bassett et al. |
| 2010/0248439 A1 | 9/2010 | Chung et al. |

(Continued)

FOREIGN PATENT DOCUMENTS

| CN | 107946213 A | 4/2018 |
| KR | 10-2010-0107661 A | 10/2010 |

OTHER PUBLICATIONS

Korean Intellectual Property Office, International Search Report and Written Opinion for International application No. PCT/US2019/042635, dated Nov. 8, 2019, 11 pages.

*Primary Examiner* — Mohammed R Alam

(57) ABSTRACT

A method of etching a substrate includes providing an etching solution in a tank of an etch processing system, where the etch processing system is configured to control temperature of the etching solution, a concentration of the etching solution, and flow of the etching solution within the tank. The substrate contains micro-fabricated structures that have alternating layers of a first material and a second material, and the etching solution including an acid that etches the first material and results in an etch product to be moved from the substrate. The method further includes monitoring a concentration of the etch product within the etching solution, and maintaining the concentration of the etch product within the etching solution below a predetermined value to prevent deposition of the etch product on the second material in an amount that blocks etching of the first material by the etching solution.

20 Claims, 5 Drawing Sheets

(56) References Cited

U.S. PATENT DOCUMENTS

| | | | |
|---|---|---|---|
| 2013/0285118 A1* | 10/2013 | Majumdar | H01L 21/02532 |
| | | | 257/192 |
| 2016/0141419 A1 | 5/2016 | Baenninger et al. | |
| 2017/0084503 A1 | 3/2017 | Kabouzi et al. | |
| 2017/0125259 A1* | 5/2017 | Wang | H01L 27/0207 |
| 2018/0102254 A1* | 4/2018 | Kim | H01L 21/47573 |
| 2019/0019688 A1* | 1/2019 | Bergman | H01L 21/324 |
| 2019/0074188 A1* | 3/2019 | Cooper | H01L 21/0214 |

\* cited by examiner

| Number of Layers | Etch Rate [A/min] | Max Silica [ppm] | Etch Distance [nm] | Etch Time [sec] | Etch Time [hr] |
|---|---|---|---|---|---|
| 77 | 62 | 70 | 303 | 2900 | 0.8 |
| 150 | 62 | 112 | 650 | 6100 | 1.7 |
| 200 | 62 | 162 | 650 | 6100 | 1.7 |

*FIG. 5*

| Number of Layers | Etch Rate [A/min] | Max Silica [ppm] | Etch Distance [nm] | Etch Time [hr] |
|---|---|---|---|---|
| 77 | 62 | 70 | 303 | 0.8 |
| 150 | 25 | 70 | 650 | 4.3 |
| 200 | 15 | 70 | 650 | 7.0 |

*FIG. 6*

ETCHING OF SILICON NITRIDE AND SILICA DEPOSITION CONTROL IN 3D NAND STRUCTURES

CROSS-REFERENCE TO RELATED APPLICATIONS

This application claims priority to U.S. Provisional Patent Application No. 62/701,398, entitled, "Etching of Silicon Nitride and Silica Deposition Control in 3D NAND Structures," filed Jul. 20, 2018; the disclosure of which is expressly incorporated herein, in its entirety, by reference.

FIELD OF INVENTION

The present invention relates to the field of semiconductor manufacturing and semiconductor devices, and more particularly to a method for wet etching a micro-fabricated structure.

BACKGROUND OF THE INVENTION

3D NAND flash is a type of flash memory in which the memory cells are stacked vertically in multiple layers and this structure represents a unique difficulty in semiconductor device manufacturing. In the manufacturing of 3D NANDs and other multilayer structures, wet etch processes are important steps for selectively removing different material layers. In the past, the general trend has been to make the temperature of the etch bath as high as possible in order to make the etch rate high and make the etch process as short as possible. However, a high etch rate can result in variety of problems including re-deposition of etch products on the multilayer structures.

SUMMARY OF THE INVENTION

A method of wet etching a micro-fabricated structure is described. The method includes providing an etching solution in a tank of an etch processing system, the etch processing system configured to control temperature of the etching solution, a concentration of the etching solution, and flow of the etching solution within the tank, submerging a substrate in the etching solution, the substrate containing micro-fabricated structures that have alternating layers of a first material and a second material, the etching solution including a first acid that etches the first material, and initiating etching of the first material at a first etch rate, etching of the first material resulting in an etch product to be moved from the substrate. The method further includes monitoring a concentration of the etch product within the etching solution, and in response to identifying that the concentration of the etch product is greater than a predetermined value, decreasing the first etch rate to a second etch rate.

According to another embodiment, the method includes monitoring a concentration of the etch product within the etching solution, and in response to identifying that the concentration of the etch product falls below a predetermined value, increasing the first etch rate to a second etch rate.

According to another embodiment, the method includes monitoring a concentration of the etch product within the etching solution, and maintaining the concentration of the etch product within the etching solution below a predetermined value to prevent deposition of the etch product on the second material in an amount that blocks etching of the first material by the etching solution.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 5 shows simulation results for the micro-fabricated structures containing the different number of alternating SiN and $SiO_2$ layers in FIGS. 2-4; and FIG. 6 shows simulation results for the micro-fabricated structures containing the different number of alternating SiN and $SiO_2$ layers according to embodiments of the invention.

DETAILED DESCRIPTION OF SEVERAL EMBODIMENTS

A method is provided for etching a substrate. The method includes providing an etching solution in a tank of an etch processing system, where the etch processing system is configured to control temperature of the etching solution, a concentration of the etching solution, and flow of the etching solution within the tank. The etch processing system can be configured to accommodate a plurality of substrates (wafers) and circulate the etching solution in the tank. The method further includes submerging a substrate in the etching solution, where the substrate contains micro-fabricated structures that have alternating layers of a first material and a second material, and where the etching solution includes an acid that etches the first material. The method further includes initiating etching of the first material at a first etch rate, where etching of the first material results in an etch product to be moved from the substrate. According to one embodiment, the method includes monitoring a concentration of the etch product within the etching solution, and in response to identifying that the concentration of the etch product is greater than a predetermined value, decreasing the first etch rate to a second etch rate.

According to another embodiment, the method includes monitoring a concentration of the etch product within the etching solution, and in response to identifying that the concentration of the etch product falls below a predetermined value, increasing the first etch rate to a second etch rate.

According to another embodiment, the method includes monitoring a concentration of the etch product within the etching solution, wherein the concentration of the etch product within the etching solution is maintained below a predetermined value to prevent re-deposition of the etch product on the second material in an amount that blocks etching of the first material by the etching solution.

Figure 1A:
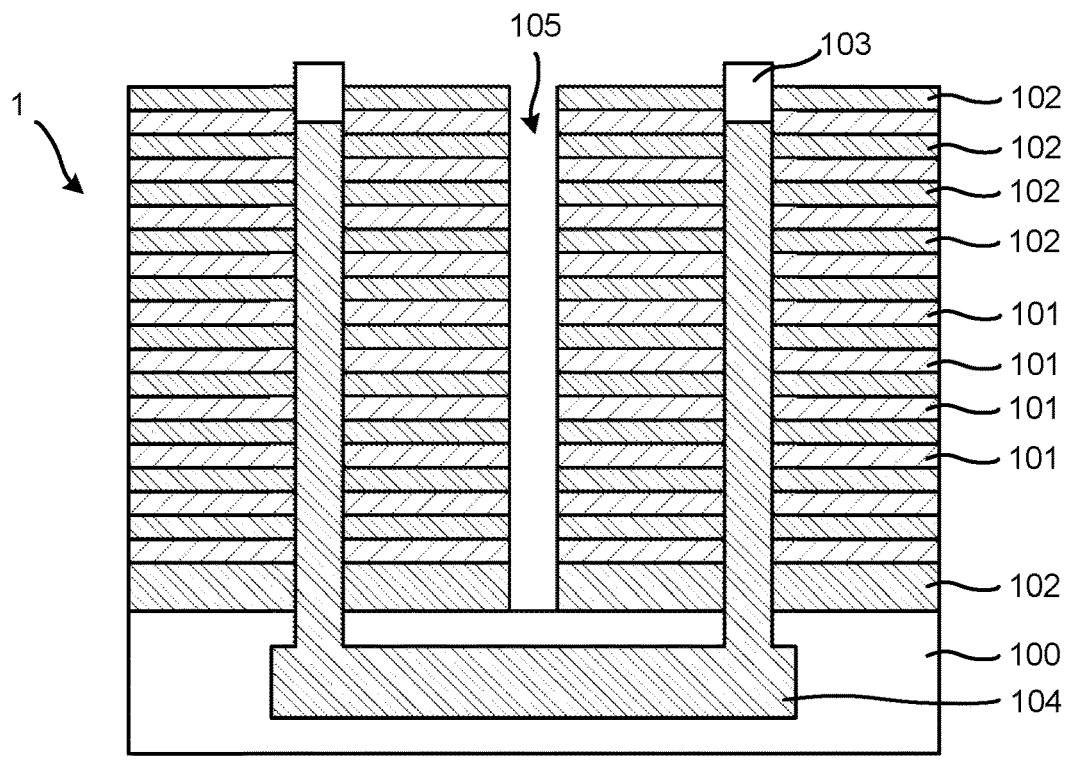
FIGS. 1A and 1B schematically show through cross-sectional views manufacturing a 3D NAND structure.

FIG. 1A schematically shows a micro-fabricated structure 1 containing alternating layers of a first material 101 and a second material 102. In general, embodiments of the invention may be applied to simple or advanced micro-structures containing alternating layers of different materials. According to one embodiment, the micro-fabricated structure 1 contains a partially manufactured 3D NAND device. 3D NANDs are commonly quantified by the total number of alternating layers. Currently, 3D NAND devices contain 64 layers but future device nodes are contemplated to contain as much as 96 layers, 128 layers, and greater. According to one embodiment, the first material 101 can contain silicon nitride (SiN) and the second material 102 can contain silicon oxide ($SiO_2$). The micro-fabricated structure 1 further contains a core 104 (e.g., $SiO_2$), a cap layer 103, and a trench 105 that connects the top of the micro-fabricated structure 1 to the bottom of the micro-fabricated structure 1. In some examples, the number of alternating layers can be about 80, about 150, about 200, or greater.

Figure 1B:
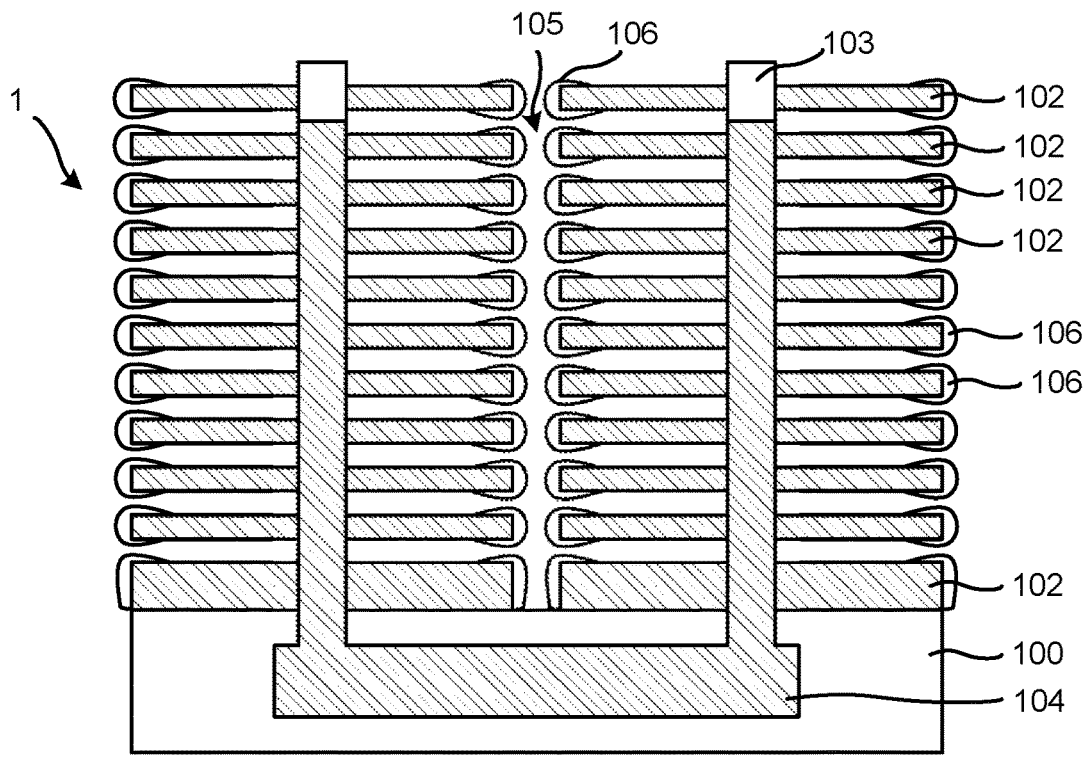

FIG. 1B shows the micro-fabricated structure 1 following a wet etching process that selectively removes the layers of the first material 101. As part of the device manufacturing process, the first material 101 is etched away, leaving the fins of the second material attached to the core 104. Due to material selectivity requirements of etching only the SiN in a 3D NAND device, while leaving the $SiO_2$ unchanged, the etch process can include immersion in a high-concentration hot phosphoric acid ($H_3PO_4$) bath containing a silica ($SiO_2$) additive to inhibit $SiO_2$ etching, which with proper tuning can have selectivity of greater than 100:1 for etching SiN:$SiO_2$. Another important factor is that an etch product of SiN etching in $H_3PO_4$ is silica (i.e., $SiO_2$), and this increases the concentration of dissolved silica in the $H_3PO_4$ bath, and in particular, in small features such as the trench 105 within the micro-fabricated structure 1. A further issue with SiN etching in an $H_3PO_4$ bath pre-seeded with silica is that above a critical silica concentration, silica deposition can occur on the substrates. This can include a silica film 106 shown in FIG. 1B that deposits on the second material 102 but can later dissolve back into solution if processing conditions are changed. The presence of the silica film 106 can hinder complete removal of the first material 101 between the fins of the second material 102, and in severe cases, completely block of the trench 105 and the channels between adjacent layers of the second material 102 before the first material 101 is fully removed.

As the number of alternating layers of the SiN and $SiO_2$ increases in every new 3D NAND device node, the unwanted deposition of silica on $SiO_2$ surfaces has become an increasingly bigger problem. Silica deposition on the $SiO_2$ layers correlates with high silica concentration in the $H_3PO_4$ bath since it involves precipitation/crystallization of a saturated solute, and the silica concentration can be used to identify correlation with silica deposition in the micro-fabricated structure 1. Deeper trenches with more layers have higher silica concentration in the trenches than more shallow ones, even with the same SiN etch rate, and this correlates with silica deposition.

Embodiments of the invention address this problem and provide a method for reducing or eliminating deposition of silica on $SiO_2$ surfaces in a 3D NAND device and other structures containing alternating layers of different materials. The method reduces the silica concentration in the trenches by reducing the etch rate of the SiN, and provides control of the silica concentration during the etch process. According to embodiments of the invention, the concentration of silica in the trenches may be controlled by one or more of 1) using reduced bath temperature in order to reduce the SiN etch rate in $H_3PO_4$, 2) using diluted $H_3PO_4$ (e.g., mixing with sulfuric acid ($H_2SO_4$)) in order to reduce the SiN etch rate, and 3) using active feedback control or multiple baths, so that the etching starts out with low silica concentration but uses a higher silica concentration towards the end of the etching.

Figure 2:
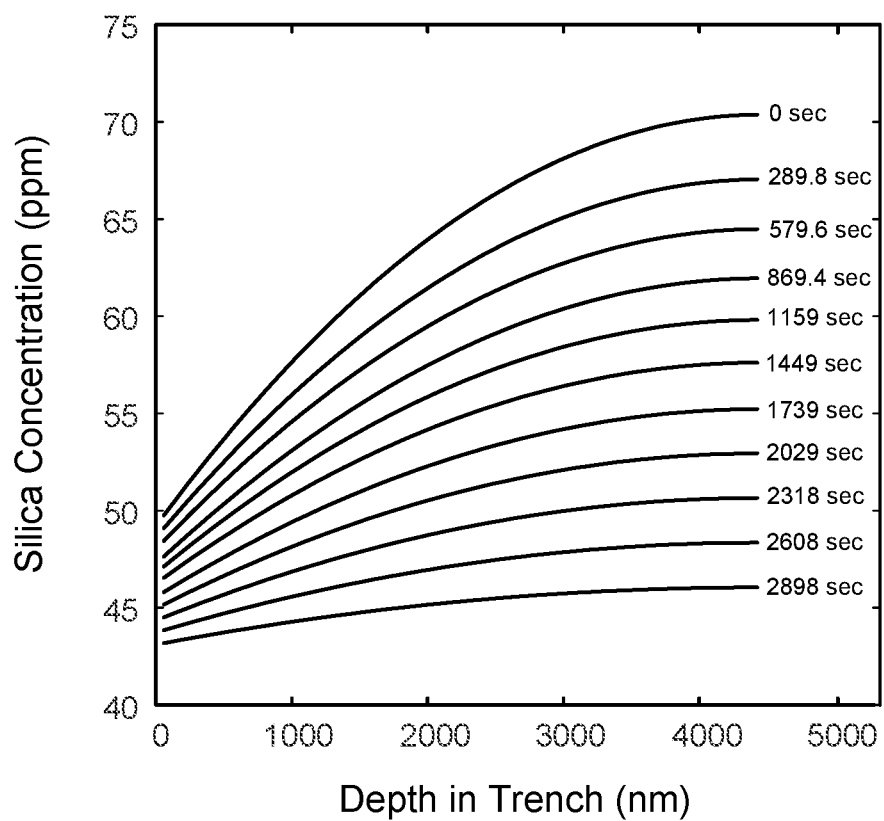
FIG. 2 shows simulated silica concentration vs. depth in a trench of a micro-fabricated structure as a function of etch time according to an embodiment of the invention.

FIG. 2 shows simulated silica concentration vs. depth in a trench of a micro-fabricated structure as a function of etch time according to an embodiment of the invention. The micro-fabricated structures on the wafers were similar to the structure in FIG. 1A but contained a total of 77 alternating SiN and $SiO_2$ layers. The simulation included a multi-scale model of domains containing 1) a gap between two wafers (substrates) in a $H_3PO_4$ bath to capture convective flow of the $H_3PO_4$ bath, 2) local flow near the wafer surface for intermediate simulation between macro-scale wafer simulation and nano-scale etching simulation, and 3) a 3D NAND structure to capture etching of silicon nitride and diffusion of reactants and etch products into and out of a trench. The results show that the silica concentration from etching in the $H_3PO_4$ bath was highest at the bottom of the trench at the beginning of the silicon nitride etch, where the silica concentration reached about 70 ppm in the trench. Thereafter, the silica concentration dropped with time in the entire trench due to increase in volume inside the trench. The bath temperature was 150° C., the $H_3PO_4$ concentration was 85.8-86.6 wt. %, and the SiN etch rate was 62Å/min.

Figure 3:
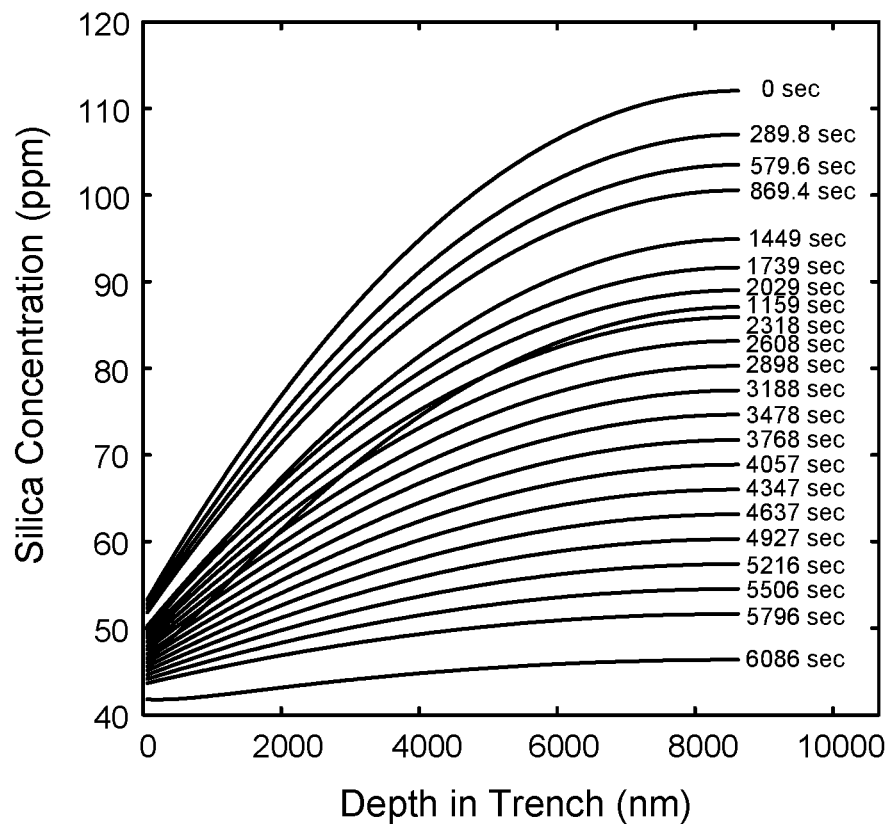
FIG. 3 shows simulated silica concentration vs. depth in trench as a function of etch time according to an embodiment of the invention.

FIG. 3 shows simulated silica concentration vs. depth in a trench of a micro-fabricated structure as a function of etch time according to an embodiment of the invention. The micro-fabricated structures on the wafers were similar to the structure in FIG. 1A but contained a total of 150 alternating SiN and $SiO_2$ layers. FIG. 3 shows that the silica concentration from etching in the $H_3PO_4$ bath was highest at the bottom of the trench at the very beginning of the silicon nitride etch, where the silica concentration reached about 112 ppm. Thereafter, the silica concentration dropped with time in the entire trench due to increase in volume inside the trench. The bath temperature was 150° C., the $H_3PO_4$ concentration was 85.8-86.6 wt. %, and the SiN etch rate was 62 Å/min.

Figure 4:
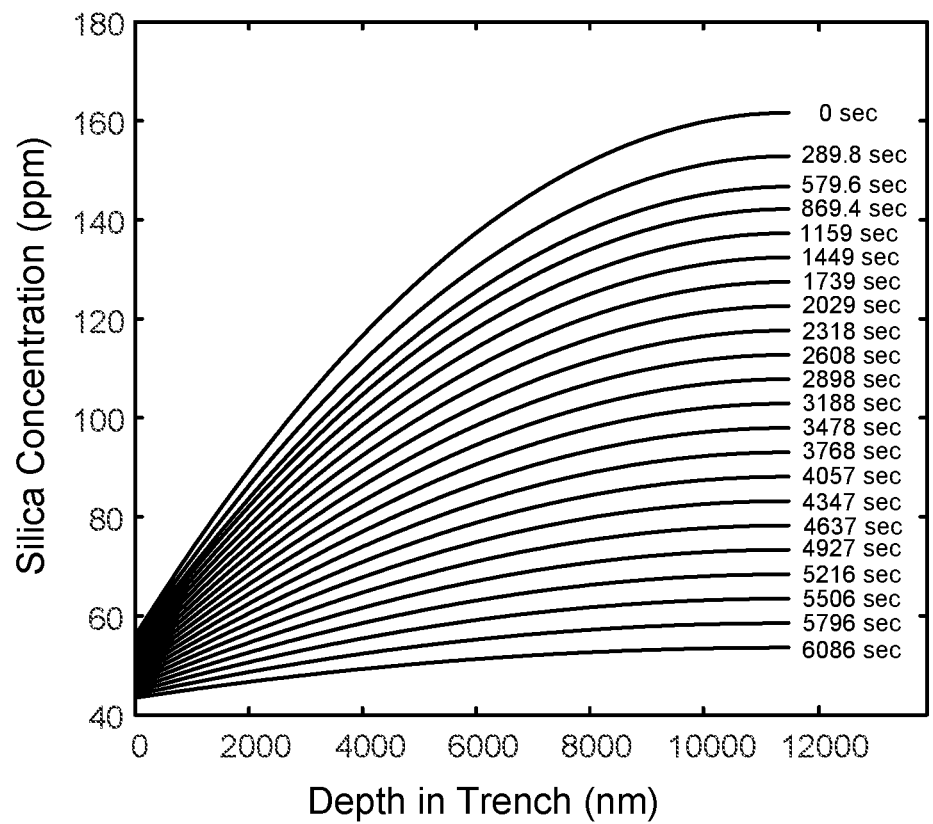
FIG. 4 shows simulated silica concentration vs. depth in trench as a function of etch time according to an embodiment of the invention.

FIG. 4 shows simulated silica concentration vs. depth in a trench of a micro-fabricated structure as a function of etch time according to an embodiment of the invention. The micro-fabricated structures on the wafers were similar to the structure in FIG. 1A but contained a total of 200 alternating SiN and $SiO_2$ layers. FIG. 4 shows that the silica concentration from etching in the $H_3PO_4$ bath was highest at the bottom of the trench at the very beginning of the silicon nitride etch, where the silica concentration reached about 162 ppm. Thereafter, the silica concentration dropped with time in the entire trench due to increase in volume inside the trench. The bath temperature was 150° C., the $H_3PO_4$ concentration was 85.8-86.6 wt. %, and the SiN etch rate was 62 Å/min.

FIG. 5 shows simulation results for the micro-fabricated structures containing the different number of alternating SiN and $SiO_2$ layers in FIGS. 2-4. The silica concentration and silica deposition in the micro-fabricated structure containing 77 alternating SiN and $SiO_2$ layers is acceptable for efficient etching of the SiN layers. For the same or similar processing conditions, silica concentration and silica deposition is unacceptably high for the micro-fabricated structures containing a higher number of SiN and $SiO_2$ layers, for example 150 layers and 200 layers. However, if the silica concentration is kept at a similar level as shown in FIG. 2, or less, throughout the entire etch process, silica deposition can be minimized or avoided and complete etching of the SiN layer can be achieved. This requires etch rates of 25 Å/min for 4.3 hours in the case of 150 layers and 15 Å/min for 7.0 hours in the case of 200 layers.

The etch rate of the SiN in $H_3PO_4$ follows a standard Arrhenius rate law, so that higher bath temperatures have a faster SiN etch rate, and lower bath temperatures have a lower SiN etch rate. A reduced temperature may be used to maintain the SiN etch rate at a value that keeps the silicon concentration in the trench below a desired threshold value. For example, a bath temperature of about 123° C. may be used to achieve a SiN etch rate of about 25 Å/min and a silica concentration of about 70 ppm for 150 alternating layers, and a bath temperature of about 108° C. may be used to achieve a SiN etch rate of about 25 Å/min and a silica concentration of about 70 ppm for 200 alternating layers. These processing conditions can be compared to a bath temperature of about 150° C. and a SiN etch rate of about 62 Å/min and a silica concentration of about 70 ppm for 77 alternating layers. This is shown in FIG. 6. In some examples, the SiN etch rate may be increased/decreased (e.g., by increasing/decreasing the bath temperature) incrementally or stepwise during the processing.

The etch rate of SiN is dependent upon the concentration of $H_3PO_4$ and water ($H_2O$) and therefore the SiN etch rate may be reduced by lowering the concentration of both of these chemicals. This may be done by adding a third chemical that is inert to $H_3PO_4$, SiN, and exposed $SiO_2$ as well. Sulfuric acid ($H_2SO_4$) can be effective in this role, although other chemicals may be used as well, for example fluorinated hydrocarbons and high molecular weight hydrocarbons. The bath temperature and/or $H_3PO_4$ and $H_2O$ concentration may also be varied throughout the SiN etch process, for example by using a lower temperature and/or lower acid concentration at the beginning of the SiN etch, and then increasing temperature and/or acid concentration during the SiN etch process. This may be performed using a single bath with a feedback loop control or with a series of successive baths with different temperature and/or acid concentrations. This approach produces a lower silica concentration inside the trench at the critical beginning of the SiN etch process, and allows a higher SiN etch rate later in the etch process when the silica concentration in the trench decreases due to increase in volume inside the trench.

According to one embodiment, the concentration of silica in the trench may be controlled using active feedback control or multiple $H_3PO_4$ baths. For example, the drop in silica concentration in the trench with etch time may be used to trigger a change in processing condition using active feedback control. This may be performed using a single $H_3PO_4$ bath that varies silica concentration with time or transitioning the substrates between a series of $H_3PO_4$ baths with different silica concentrations. In one example, low silica concentration that provides adequate $SiN/SiO_2$ etch selectivity may be used early in the SiN etch process and a higher silica concentration and higher $SiN/SiO_2$ etch selectivity may be used later in the SiN etch process, while maintaining the silica concentration below a predetermined threshold value to prevent silica deposition inside the trench.

A plurality of embodiments for methods of etching micro-fabricated structures with alternating layers of different materials have been described. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. It is therefore intended that the scope of the invention be limited not by this detailed description, but rather by the claims appended hereto.

What is claimed is:

1. A method of etching a substrate, the method comprising:
providing an etching solution in a tank of an etch processing system, the etch processing system configured to control temperature of the etching solution, a concentration of the etching solution, and flow of the etching solution within the tank;
submerging a substrate in the etching solution, the substrate containing micro-fabricated structures that have alternating layers of a first material and a second material, the etching solution including an acid that etches the first material;
initiating etching of the first material at a first etch rate, etching of the first material resulting in an etch product to be moved from the substrate;
monitoring a concentration of the etch product within the etching solution; and
in response to identifying that the concentration of the etch product is greater than a predetermined value, decreasing the first etch rate to a second etch rate.

2. The method of claim 1, wherein decreasing the first etch rate is executed by reducing a temperature of the etching solution.

3. The method of claim 1, wherein decreasing the first etch rate is executed by reducing a concentration of the acid within the etching solution.

4. The method of claim 1, further comprising
in response to identifying that the concentration of the etch product is below a second predetermined value, increasing a given etch rate to a third etch rate.

5. The method of claim 4, wherein increasing the given etch rate is executed by increasing a temperature of the etching solution.

6. The method of claim 4, wherein increasing the given etch rate is executed by increasing a concentration of the acid within the etching solution.

7. The method of claim 1, wherein the first material contains silicon nitride, the second material contains silicon oxide, and the etch product includes silica.

8. The method of claim 7, wherein the acid includes phosphoric acid.

9. The method of claim 7, where the predetermined value of the concentration of the etch product is about 70 ppm in the etching solution.

10. The method of claim 1, wherein the substrate is one of multiple substrates in the tank.

11. The method of claim 10, wherein a spacing of the multiple substrates enables convective flow of the etching solution.

12. The method of claim 1, wherein the micro-fabricated structure includes a memory device.

13. The method of claim 12, wherein the memory device includes a 3D NAND device.

14. A method of etching a substrate, the method comprising:
providing an etching solution in a tank of an etch processing system, the etch processing system configured to control temperature of the etching solution, a concentration of the etching solution, and flow of the etching solution within the tank;

submerging a substrate in the etching solution, the substrate containing micro-fabricated structures that have alternating layers of a first material and a second material, the etching solution including an acid that etches the first material;

initiating etching of the first material at a first etch rate, etching of the first material resulting in an etch product to be moved from the substrate;

monitoring a concentration of the etch product within the etching solution; and in response to identifying that the concentration of the etch product falls below a predetermined value, increasing the first etch rate to a second etch rate.

15. The method of claim 14, wherein the first material contains silicon nitride, the second material contains silicon oxide, the etch product includes silica, and the acid includes phosphoric acid.

16. A method of etching a substrate, the method comprising:

providing an etching solution in a tank of an etch processing system, the etch processing system configured to control temperature of the etching solution, a concentration of the etching solution, and flow of the etching solution within the tank;

submerging a substrate in the etching solution, the substrate containing micro-fabricated structures that have alternating layers of a first material and a second material, the etching solution including an acid that etches the first material;

initiating etching of the first material at a first etch rate, etching of the first material resulting in an etch product to be moved from the substrate;

monitoring a concentration of the etch product within the etching solution; and maintaining the concentration of the etch product within the etching solution below a predetermined value to prevent deposition of the etch product on the second material in an amount that blocks etching of the first material by the etching solution, wherein the maintaining is performed by controlling the first etch rate through one or more of the temperature of the etching solution, the concentration of the etching solution, and the flow of the etching solution within the tank.

17. The method of claim 16, wherein maintaining the concentration of the etch product within the etching solution below a predetermined value includes controlling the temperature of the etching solution, controlling the concentration of the acid, or both.

18. The method of claim 16, wherein the first material contains silicon nitride, the second material contains silicon oxide, and the etch product includes silica.

19. The method of claim 18, wherein the acid includes phosphoric acid.

20. The method of claim 19, where the predetermined value of the concentration of the etch product is about 70 ppm or less in the etching solution.

* * * * *